United States Patent [19]

Radice

[11] Patent Number: 4,565,615

[45] Date of Patent: Jan. 21, 1986

[54] GLOW DISCHARGE STABILIZATION OF PIEZOELECTRIC POLYMER FILM

[75] Inventor: Peter F. Radice, Upper Merion, Pa.

[73] Assignee: Pennwalt Corporation, Philadelphia, Pa.

[21] Appl. No.: 667,187

[22] Filed: Nov. 1, 1984

[51] Int. Cl.$^4$ .............................................. C07C 3/24
[52] U.S. Cl. ................................... 204/168; 204/169; 264/22; 427/40
[58] Field of Search .................. 204/168, 169; 264/22; 427/40

[56] References Cited

U.S. PATENT DOCUMENTS

| | | | |
|---|---|---|---|
| 3,901,994 | 8/1975 | Mehalso | 204/168 |
| 4,291,245 | 9/1981 | Nowlin | 264/22 |
| 4,308,370 | 12/1981 | Fukada | 264/22 |
| 4,393,093 | 7/1983 | Sprout, Jr. | 427/100 |

*Primary Examiner*—John F. Niebling

[57] ABSTRACT

Methods are disclosed for stabilizing poled piezoelectric and pyroelectric polymer films by exposing the poled film to a glow discharge at a reduced pressure for a sufficient period to thereby remove unwanted and unstable homo- and hetero-charges from the poled film.

12 Claims, No Drawings

GLOW DISCHARGE STABILIZATION OF PIEZOELECTRIC POLYMER FILM

STATEMENT OF THE INVENTION

This invention relates to poled piezoelectric and pyroelectric polymer films and more particularly concerns such films which become stabilized by exposing them to a glow discharge at a reduced pressure for a sufficient time period.

BACKGROUND AND SUMMARY OF THE INVENTION

Films of certain polymers are capable of acquiring a static electric charge upon being poled, i.e., being exposed to a corona discharge or a dc field, which static charge is quasi-permanent, the degree of permanency being dependent largely upon the chemical constitution of the film. Such a charge, due largely to trapped positive and negative carriers positioned at or near the surfaces of the film, produces what is known as an electret. The term "film", as used herein, is understood to include thicknesses up to about 0.060 inches.

In addition to being capable of acquiring a static electric charge, the polymer film may also acquire an ordered internal molecular orientation when electrically polarized so that even when the static charges are dissipated, the film thereafter possesses the property of being able to generate an electric current between opposed surfaces thereof, when electrically connected, by applying a load or pressure to the opposed surfaces. This property is known as the piezoelectric effect. Films made from poly(vinylidene fluoride) (PVDF) or vinylidene fluoride polymers, for example, may be poled to exhibit this effect as well as a pyroelectric effect, i.e., the property of producing electron flow by changing the temperature of the film.

The object of poling is to align the dipoles within the polymer film such that the film displays permanent piezo and pyroelectric properties. The dipolar alignment in a piezoelectric polymer film is in an opposite direction to the polarizing field while charges injected into the film are of the same sign as the polarizing voltage. Charges on the film surface of opposite sign to the polarizing voltage imposed on that surface are termed "heterocharges" while charges of the same sign are termed "homocharges". Heterocharges and homocharges are described and shown in U.S. Pat. No. 4,055,878, incorporated herein by reference.

The extent to which the dipoles of the polymer film have been aligned can be determined by several methods. A simple procedure involves the application of a load to the film in a direction normal to the film's surface and detecting the resultant charge output on a suitable meter. If the resultant charge on the surface of the film is a heterocharge, the output charge due to the imposed testing will be in one expected direction. Conversely, if the resultant charge on the surface of the film is a homocharge, the output charge due to the load will be in the other direction.

The procedure for poling is well known in the art and, in the case of dielectric polymer films, generally involves the application of a direct current voltage, e.g., 300 to 2000 kilovolts per centimeter of thickness of polymer film while first heating it to a temperature ranging between just above room temperature to just below the melting point of the film for a period of time and then, while maintaining the potential, cooling the film. Preferred systems for the continuous poling of piezoelectric (or pyroelectric) sensitive polymer film using a corona discharge to induce the piezoelectric charge are described in U.S. Pat. No. 4,392,178 and U.S. Pat. No. 4,365,283, both incorporated herein by reference.

Poling results in permanent polarization, as above-mentioned, due to aligned dipoles. Additionally, real charges or homocharges are injected and concentrated along the film surface, and are of the same polarity as the poling electrode. These homocharges can mask the effect of the permanent heterocharges due to the permanent orientation of the dipoles and can thus produce a false piezoelectricity. Homocharges are capable of remaining on a poled dielectric film or sheet for months unless intentionally removed. Storage of real charges can therefore be quite permanent with long decay times. A further complication is the instability of the heterocharges which can also exist in the polarized polymer films. The present invention is directed toward the removal of both unstable homo- and heterocharges.

Various techniques for stabilizing electrically charged materials or polymer films are disclosed in the prior art. U.S. Pat. No. 3,660,736 discloses a heat treatment for stabilizing electrets having unstable heterocharges and homocharges thereon; U.S. Pat. No. 3,793,715 discloses stabilizing an electret having heterocharges and homocharges by contacting the electret with water to cause decay of the unstable charges; U.S. Pat. No. 3,755,043 teaches the stabilizing of an electret by covering opposite surfaces of a high molecular weight based material before polarization thereof with thin films of another high molecular weight material; U.S. Pat. No. 4,055,878, mentioned above, discloses stabilizing piezoelectric resin elements by applying a high pressure to the poled piezoelectric resin element for a given time, and short circuiting the surface of said element under pressure; U.S. Pat. No. 4,393,093 teaches the enhancement of polarizability of polymer films by treating the film with a glow discharge at a reduced pressure; U.S. Pat. No. 4,459,634 reveals methods for stabilizing a poled polymeric piezoelectric film by exposing it to an electric field of a polarity reversed from that employed in the poling step to remove unstable homo- and hetero-charges from the poled film.

After the vast majority of poling procedures, unstable hetero- and/or homocharges are present in the polymer film; these unstable charges must be removed prior to either using the film in a piezo or pyro device, or performing accurate tests thereon.

The present invention discloses methods for removing these unwanted unstable charges, while virtually leaving undisturbed the important stable aligned dipoles, and is directed to methods of stabilizing a poled piezoelectric or pyroelectric polymer film comprising exposing the surfaces of said poled polymer film to a glow discharge at a reduced pressure for a time sufficient to provide stabilized poled polymer film. The glow discharge bathes the poled film in a medium of gaseous charges which effectively stabilize the film. Treatment of the film in this manner may be adapted for non-continuous batch applications, or for continuous poling operations, as from reel to reel, of poled piezoelectric polymer film. Long delays between the steps of polarization and stabilization can be tolerated in the practice of the present invention.

DETAILED DESCRIPTION OF THE INVENTION

Poled piezoelectric or pyroelectric polymer film to which the processes of the present invention are applicable are those formed from high molecular weight polymers, such, for example, as polyvinylidene fluoride, polyvinylfluoride, polyvinylchloride, and polyamides. Such polymers may be homopolymers, copolymers, or terpolymers, as well as polymer mixtures or blends. Preferred polymers are those containing at least a major mol proportion of vinylidene fluoride, including, for example, vinylidene fluoride homopolymers and copolymers or terpolymers containing at least 65 mol percent of vinylidene fluoride and at least one other copolymerizable halogenated monomer such as trifluoroethylene, tetrafluoroethylene or vinylfluoride, for example.

By poled piezoelectric or pyroelectric polymer film is meant a film that has acquired a piezoelectric activity of at least 5 pico-Coulombs per Newton (pC/N) when subjected to a dc field, i.e., about 0.5 to 15 kilovolts per mil thickness of film.

The poled film to be stabilized in accordance with the present invention possesses both piezoelectric and pyroelectric properties. Reference hereinafter is made to the film's piezoelectric properties, it being understood that the film also possesses pyroelectric properties.

The poled piezoelectric polymer film of the present invention may be of any shape or form and may range widely in thickness and length.

Stablilization by the methods of the present invention may be carried out on poled polymer films that were previously monoaxially, biaxially, or multiaxially oriented. Unoriented poled film may also be stabilized by the methods disclosed herein.

The piezoelectric element or film may be coated on each side with a thin electrically conductive coating prior to poling, although the film may remain without permanent electrode coatings until well after the stabilizing treatment. Applying the conductive coatings to the film is made by vapor deposition, screen printing, painting, electroplating, sputtering, metalizing, and the like. Various known conductive materials, typically aluminum, may be used for the coatings. The conductive coatings are in complete contact with the polymer film and distribute the dc field substantially uniformly thereover.

The poled film may be exposed to glow discharge in a conventional vacuum chamber used in a conventional metalizing of polymer films. The glow discharge may be created by evacuating the chamber to a low pressure ranging between about 10 to 2000 micrometers ($\mu$m), preferably from about 20 to 1000 $\mu$m, and more preferably from about 30 to 120 $\mu$m, and providing a voltage potential from an ac or dc power source to form a glow discharge from a suitable electrode or electrodes. The potential required to form the glow discharge varies with the pressure of the specific ionizable gas selected and temperature within the chamber. For example, a potential of up to about 10 kilovolts may be required with a chamber size of about 40 inches in diameter. For stabilizing films in ionizable gases other than air, it may be necessary initially to remove any air from the chamber by evacuating it to a pressure of approximately 0.1 $\mu$m and then back filling to the desired pressure, for example, with an ionizable gas such as helium, hydrogen, neon, argon, nitrogen, oxygen, carbon dioxide, carbon monoxide, ammonia, or fluorocarbon gases, to thereby produce specific ionic species on glow discharge. When air, however, it to be used as the ionizable gas, the chamber is merely evacuated to the desired pressure. The surfaces of the poled piezoelectric polymer film or sheet are then exposed to the glow discharge for a time sufficient to stabilize the poled polymer film by removing the unstable homo- and heterocharges. During the exposing period, the poled polymer film is maintained at a temperature ranging between room temperature to about 100° C., and preferably from about room temperature to about 50° C. Film can be processed in the vacuum chamber in a batch or continuous operation, it being desirable that the poled film be permitted to pass through the chamber for the continuous type operation at speeds no greater than the speed which effects its proper stabilization. In batch operations, normal exposure time to the glow discharge ranges typically between about 5 to 10 minutes, although exposure times of lesser duration have been found to work quite satisfactorily.

In single pass operations through the chamber, a speed of up to 20 feet per minute may be employed to stabilize poled film. Speeds approaching several hundred feet per minute, however, may be used where the film is caused to pass along a circuitous route within the chamber. Continuous operations typically require the poled film to be unwound from a supply roll for winding on a take-up roll. In either batch or continuous tupe operations, both surfaces of the poled film should be similarly exposed to the glow discharge if satisfactory stabilization is to result.

The following example is illustrative of the present invention.

EXAMPLE I

A strip of uniaxially oriented poly(vinylidene fluoride) film was poled in accordance with the corona discharge poling process disclosed in U.S. Pat. No. 4,365,283. A roll of the poled film, having a thickness of about 1 mil, was placed in the vacuum chamber (diameter about 38 inches) of a Varian vacuum metallizer equipped to provide a glow discharge within the chamber. Air was used as the ionizable gas. The chamber was evacuated to a pressure of 90 $\mu$m and glow discharge was created in the chamber by turning on the power supply and slowly increasing the power until commencement of the glow; the power was adjusted as necessary, i.e., between about 500 to 700 volts.

The roll of poled film was continuously rolled from a supply roll onto a take-up roll within the chamber at a speed of about 11 feet per minute in a single pass. Both surfaces of the film were similarly exposed to the glow discharge. Chamber temperature was maintained at ambient.

To afford a valid basis for comparison, i.e., among unstabilized film, pressure stabilized film, and film stabilized in accordance with the methods disclosed in the present invention, pieces of, or samples from the same sheet of poled PVDF film were treated in accordance with the description following Table I below.

TABLE I

| Test Sample No. | Relative Values of Charge Output For Poled 1 mil Thick PVDF Films | | | | | | | | | | $d_t$ Activity for test Sample No. 10 |
|---|---|---|---|---|---|---|---|---|---|---|---|
| | 1 | 2 | 3 | 4 | 5 | 6 | 7 | 8 | 9 | 10 | |
| Unstabilized | .51 | .58 | .62 | .66 | .66 | .66 | .66 | .68 | .68 | .68 | 14.4 pC/N |
| Pressure Stabilized (500 lb. psi overnight) | .65 | .76 | .81 | .86 | .86 | .86 | .86 | .86 | .86 | .86 | 18.5 |
| Glow discharge (Single Pass at 11 ft/min., 90 μm pressure) | 1.0 | 1.0 | 1.0 | 1.0 | 1.0 | 1.0 | 1.0 | 1.0 | 1.0 | 1.0 | 21.2 |

Testing of the poled samples in Table I above involves a static pressure method which measures the thickness mode strain constant $d_t$. The film sample to be tested is compressed in its thickness direction between brass platens having a diameter of 1½ inches. The platens are electrically isolated and capable of functioning as electrodes to detect charge output when loads are applied to the film samples. Thus, in Table I, Unstabilized test sample No. 1 was subjected to a load of 1000 lbs. between the platens, at which time the press is returned to a zero reading before an additional 1000 lb. incremental load is hand cranked into the press. The respective loads may be maintained on the film for a few seconds only and the time interval between application of loads is not critical.

In order to obtain the relative charge output value in Table I for Unstabilized test sample No. 2, the previously tested Unstabilized test sample No. 1 was kept in the press and agian subjected to a 1000 lb. load as described above, the press again returned to a zero reading prior to applying the additional 1000 lb. incremental load. The relative value of the charge output from Unstabilized test sample No. 1 to No. 2 increased by 0.07, i.e., from 0.51 to 0.58, indicating the instability of unstabilized samples.

The relative value of charge output from Unstabilized test sample No. 10 is only 0.02 greater than the value obtained from test sample No. 4. The $d_t$ activity for Unstabilized test sample No. 10 is 14.4 pC/N, calculated by dividing the coulomb reading obtained from the press by the force in Newtons.

In order to obtain data for Pressure Stabilized test sample No. 1, the poled film sample was subjected to the identical pressures of Unstabilized test sample No. 1, but additionally, remained in the press overnight under a pressure of 500 psi, to yield a relative charge output value of 0.65 the following morning. The sample was again subjected to the usual 1000 lb. load and subsequent 1000 lb. incremental load resulting in an 0.76 relative charge value for Pressure Stabilized test sample No. 2, and so on. the relative values for test sample No. 4 through 10 remained constant at 0.86 to provide a $d_t$ activity for test sample No. 10 of 18.5 pC/N.

Relative charge output values obtained from the inventive glow discharge samples (90 μm of pressure) were constant throughout indicating that a single pass through the glow discharge environment at the stated reduced pressure was adequate to effectively stabilize the poled film sample.

No significant improvement in film stability was obtained when the glow discharge vacuum chamber was backfilled with argon gas, for example, under similar conditions to those employed for air.

The glow discharge methods described hereinabove are considered to have high commercial potential for stabilizing rolls of poled film.

I claim:

1. Method of stabilizing a poled piezoelectric and pyroelectric polymer film comprising the step of exposing surface of said film to a glow discharge at a reduced pressure for a time sufficient to form said stabilized film.

2. Method of claim 1 wherein said poled polymer film is devoid of metallized coatings on surfaces thereof.

3. Method of claim 1 wherein said poled polymer film is provided with metallized coatings on at least one surface thereof.

4. Method of claim 1 wherein said poled polymer film is maintained at a temperature between room temperature to about 100° C. during said exposing step, and preferably from about room temperature to about 50° C.

5. Method of claim 1 wherein said poled polymer film is oriented in at least one direction.

6. Method of claim 1 wherein said reduced pressure ranges between about 10 to 2000 μm, and preferably between about 30 to 120 μm.

7. Method of claim 1 wherein said glow discharge is in air at a reduced pressure.

8. Method of claim 1 wherein said glow discharge is in an ionizable gas at a reduced pressure, said ionizable gas being selected from the group consisting of helium, hydrogen, argon, nitrogen, oxygen, carbon dioxide, carbon monoxide, ammonia, and fluorocarbon gases.

9. Method of claim 1 wherein surfaces of said poled polymer film pass continuously through said glow discharge.

10. Method of claim 1 wherein said poled polymer film is a polymer of at least 65 mol percent of vinylidene fluoride and from 0 to 35 mol percent of at least one other copolymerizable monomer.

11. Method of claim 10 wherein said polymer is a homopolymer of vinylidene fluoride.

12. Method of claim 10 wherein said polymer film is a copolymer of vinylidene fluoride and a compound selected from the group consisting of tetrafluoroethylene and trifluoroethylene.

* * * * *